(12) United States Patent  
Reinwald et al.

(10) Patent No.: US 9,178,475 B2  
(45) Date of Patent: Nov. 3, 2015

(54) METHOD FOR OPERATING AN AMPLIFIER MODULE OF A SATELLITE

(71) Applicant: Tesat-Spacecom GmbH & Co. KG, Backnang (DE)

(72) Inventors: Gerhard Reinwald, Aspach (DE); Hanspeter Katz, Stuttgart (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 54 days.

(21) Appl. No.: 14/201,201

(22) Filed: Mar. 7, 2014

(65) Prior Publication Data

US 2014/0253231 A1   Sep. 11, 2014

(30) Foreign Application Priority Data

Mar. 8, 2013 (DE) .......................... 10 2013 003 903

(51) Int. Cl.
*H04B 7/185* (2006.01)
*H03F 3/22* (2006.01)
*H03F 3/189* (2006.01)
*H03F 3/58* (2006.01)

(52) U.S. Cl.
CPC ................. *H03F 3/22* (2013.01); *H03F 3/189* (2013.01); *H03F 3/58* (2013.01)

(58) Field of Classification Search
CPC ...... H04B 7/18515; H04B 1/18; H04B 7/1851
USPC ............................ 455/427, 194.2, 341, 12.1
See application file for complete search history.

(56) References Cited

U.S. PATENT DOCUMENTS

| | | | |
|---|---|---|---|
| 5,101,173 A | | 3/1992 | DiPiazza et al. |
| 6,097,929 A | * | 8/2000 | Hassall et al. ............... 455/12.1 |
| 2006/0103460 A1 | | 5/2006 | Eng |
| 2012/0156988 A1 | | 6/2012 | Mouchon et al. |

FOREIGN PATENT DOCUMENTS

| | | |
|---|---|---|
| EP | 1 478 088 A2 | 11/2004 |
| WO | WO 2006/065388 A1 | 6/2006 |

OTHER PUBLICATIONS

European Search Report dated Jun. 2, 2014, with partial English translation (Six (6) pages).

\* cited by examiner

*Primary Examiner* — Tu X Nguyen
(74) *Attorney, Agent, or Firm* — Crowell & Moring LLP

(57) ABSTRACT

A method for operating an amplifier module of a communication satellite involves saving at least one configuration parameter of the amplifier module in a non-volatile memory designed to store the configuration parameter when the amplifier module is not energized. The configuration parameter can be loaded from the non-volatile memory and used to configure the amplifier module.

15 Claims, 1 Drawing Sheet

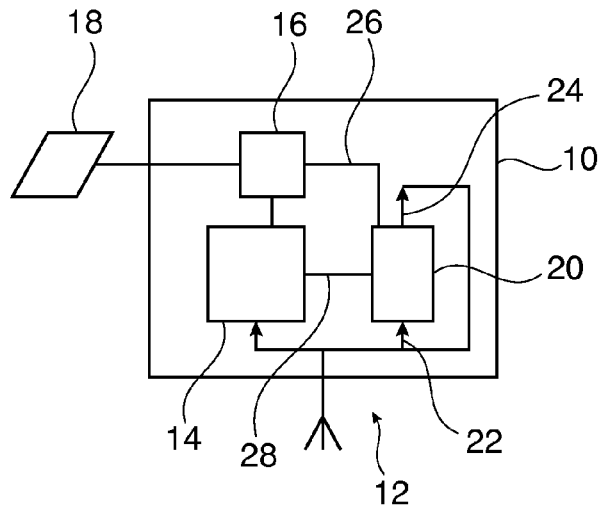
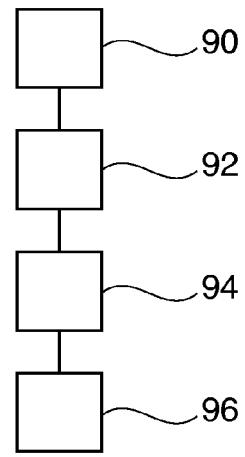
Fig. 1  Fig. 3
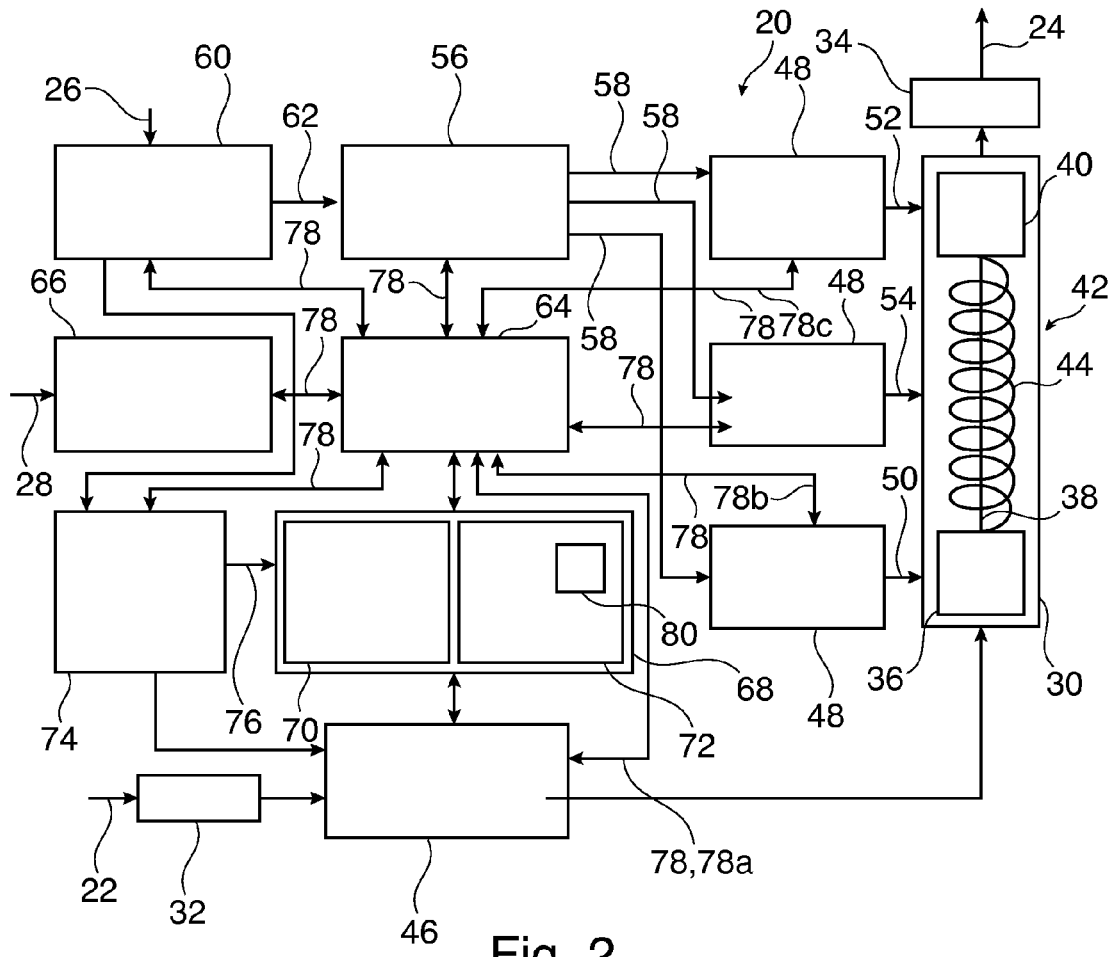
Fig. 2

METHOD FOR OPERATING AN AMPLIFIER MODULE OF A SATELLITE

CROSS-REFERENCE TO RELATED APPLICATIONS

The present application claims priority under 35 U.S.C. §119 to German Patent Application No. 10 2013 003 903.7, filed Mar. 8, 2013, the entire disclosure of which is herein expressly incorporated by reference. This application is related to U.S. patent application Ser. No. 14/200,586, filed on even date herewith, entitled "Method for Operating a Traveling-Wave Tube Module," the entire disclosure of which is herein expressly incorporated by reference.

FIELD OF THE INVENTION

Exemplary embodiments of the present invention relate to a method for operating an amplifier module of a communication satellite as well as to an amplifier module.

BACKGROUND OF THE INVENTION

Traveling wave tube amplifiers (TWTA) are used primarily in satellites as a power amplifier and are usually designed as traveling wave tube modules. These traveling wave tube modules comprise a traveling wave tube, which determines primarily the high frequency properties, and a power supply, which generates primarily the supply voltages for the traveling wave tube, a telemetry and/or telecommand interface to the satellite, as well as a control unit. The traveling wave tube module can be complemented with a pre-amplifier (also called a channel amplifier), which can also include a linearizer, which can also be integrated with other components in a housing. This combination is referred to as a high frequency power module.

A high frequency signal is amplified in a traveling wave tube by conveying an electron beam past a conductor that usually exhibits the shape of a helix and through which the high frequency signal flows. When the conductor and the electron beam are suitably configured, the energy from the electron beam can be transferred to the high frequency signal.

Traveling wave tube modules and, in general, amplifier modules are generally constructed in such a way that devices of the same type are interchangeable, so that a user can place them on the satellite in any way. In particular, a satellite can have a plurality of identically structured traveling wave tube modules, each of which is assigned a channel of the satellite; and these traveling wave tube modules are used to amplify the high frequency signal of the respective channel.

This means that the properties of the individual channels are not taken into consideration. After the amplifier modules are switched on, they can then be configured for the channel properties and/or type of mode per telecommand (i.e. by means of a command from a ground station). This configuration process has to be performed anew after each power on.

SUMMARY OF THE INVENTION

Exemplary embodiments of the present invention are directed to an amplifier module that is simple and easy to configure.

One aspect of the invention relates to a method for operating an amplifier module of a communication satellite.

The amplifier module can comprise an amplifier unit and a control unit to drive the amplifier unit. It should be recognized that the communication satellite can have a plurality of amplifier modules, each of which can be assigned to a channel of the satellite.

The amplifier module can be a traveling wave tube module, in which the gain takes place by means of a traveling wave tube. However, it is also possible that the amplifier module is a semiconductor amplifier module with a semiconductor amplifier.

According to one embodiment of the invention, the method comprises the steps: saving at least one configuration parameter of the amplifier module in a non-volatile memory designed to store the configuration parameter, when the amplifier module is not energized; after the amplifier module is energized, loading the configuration parameter from the non-volatile (data) memory; and configuring the amplifier module as a function of the loaded configuration parameter.

In this context "energizing the amplifier module" should be understood to mean switching on the amplifier module by supplying power to the circuit of the amplifier module, such as, for example, a pre-amplifier/a linearizer of a traveling wave tube module.

The non-volatile memory is usually designed to withstand the environmental conditions in space. That is, the non-volatile memory can be resistant to temperature fluctuations over a large range and/or resistant to radiation. The environmental conditions, to which a satellite in operation is exposed, discourage the person skilled in the art from installing a plurality of electronic components that are not interchangeable or that can be interchanged only with difficulty, when the satellite is in orbit.

The non-volatile memory is usually designed to buffer a plurality of configuration parameters, when the amplifier module is not energized, for example, when it has been separated from the power supply of the satellite by a master controller of the satellite.

In this case a configuration parameter may be, in general, a data value that can be used by a control unit of the amplifier module to configure and/or to adjust itself and/or additional components of the amplifier module, such as, for example, a regulator unit and/or an amplifier unit.

In particular, adjustments (i.e. configuration parameters), which are made by the operator of the satellite, can be saved and retrieved when the amplifier module is switched on, so that the amplifier module is immediately in the desired configuration.

For example, the non-volatile memory can be read out, and a read-out value can be transferred into a register. Then any changes made in this register can be written back either automatically or upon command into the non-volatile memory. Even if changes are not made directly in the non-volatile memory, it is possible that these changes are then automatically applied and/or applied per command in the register.

Saving the configuration parameters in a non-volatile memory can have the following advantages.

The operator of the satellite can optimize the individual amplifier modules during satellite tests on the ground. For example, the operator can adjust an output power to a value that is used in the channel that is to be provided; and/or the operator can configure a channel amplifier and/or a linearizer. In orbit the amplifier module is in the optimal state immediately after it has been switched on and does not have to be first adjusted by means of a number of telecommands.

Furthermore, the situation may arise that the amplifier module is switched off in orbit because of a safety circuit and/or is switched off per telecommand for operational reasons. After the amplifier module is switched on again, the amplifier module may be in exactly the state, in which it was prior to the last power off, and does not have to be re-adjusted.

According to one embodiment of the invention, the method comprises the further steps of: separating the amplifier module from a power supply of the satellite, after the configuration parameter has been saved; and connecting the amplifier module to the power supply prior to loading the configuration parameter. As stated, these steps can be executed by a master controller and/or a control unit outside the amplifier module, for example, by means of a safety circuit and/or by means of a telecommand, which can be sent, for example, from a ground station to the satellite.

According to one embodiment of the invention, the method further comprises the step of: determining a change in the configuration parameter, in which case the configuration parameter is automatically saved in the non-volatile memory, when a change has been determined. For example, a software function of the control unit can monitor certain memory areas of a volatile memory of the control unit and then, whenever these memory areas are changed, the changes are immediately applied in the non-volatile memory. Every time that the configuration is changed or more specifically every time certain configuration parameters are changed, the new configuration or more specifically the modified configuration parameters is and/or are automatically saved in the non-volatile memory.

It is also possible that the current configuration or more specifically the configuration parameter(s) is and/or are applied automatically in the non-volatile memory prior to the last power off, independently of whether a change was made or not.

It is also possible that all or only some of the configuration parameters are automatically saved. If the operator of the satellite would like to have certain configuration parameters, independently of the current adjustment or rather configuration, always in a certain setting after power on, then it is possible to suppress the save operation of the current adjustment of these parameters.

According to one embodiment of the invention, the method further comprises the step of receiving a telecommand that a configuration parameter is to be saved; in this case the configuration parameter is saved in the non-volatile memory, when the telecommand has been received. In this way configuration parameters can be changed only once by the ground station and are then made available after the amplifier module is restarted.

The current adjustment does not have to be automatically saved or more specifically the current configuration parameters do not have to be automatically saved, but rather they are not saved until after a corresponding (tele)command. In the event of a corresponding memory command, the configuration parameters can be loaded into the non-volatile memory, from where they can be retrieved again. This approach may have the advantage that the amplifier module can always be switched on, if desired by the operator of the satellite, in the same wake-up state, but thereafter can be put into the desired operating state without a comprehensive configuration process.

According to one embodiment of the invention, a configuration area can be transferred or rather copied from a volatile memory of the amplifier module to the non-volatile memory in order to save the configuration parameter. In order to load the configuration parameter, the content of the non-volatile memory can be transferred or more specifically copied to the configuration area. This approach allows a plurality of configuration parameters to be saved and set at the same time.

According to one embodiment of the invention, the method further comprises the step of: determining that at least one specific configuration parameter is not transferred or more specifically copied from the configuration area to the non-volatile memory, in order to prevent the configuration parameter in the non-volatile memory from being overwritten.

According to one embodiment of the invention, a configuration parameter is an adjustment of a regulator unit designed to regulate a voltage of a traveling wave tube of a traveling wave tube module, a cathode voltage of the traveling wave tube, a Wehnelt voltage of the traveling wave tube, an anode voltage of the traveling wave tube, one or more collector voltages or any other operating variable of the traveling wave tube. Any or all specific control parameters of the traveling wave tube can be buffered in the non-volatile memory, in order to be able to operate the traveling wave tube again in the same configuration after the last power off, without having to make any additional adjustments.

According to one embodiment of the invention, the method further comprises the step of saving a set of the configuration parameters of the amplifier module in the non-volatile memory. It is not only possible to save individual configuration parameters, but it is also possible, as an alternative or in addition, to save groups or rather sets of configuration parameters and/or information that relates to these sets. The adjustments of the voltages and the currents can be combined together to form sets of parameters that can be retrieved only as a set, for example, as a function of the frequency range, in which the amplifier module is to be operated. The user can select a set between 1 and n as the set that is to be saved. The information (i.e., for example, a number between 1 and n) which set of parameters is selected for saving can also be saved in the non-volatile memory. Then, in addition and beyond this step, additional adjustments or rather additional configuration parameters, for example, the output power, can be made and saved.

The configuration that can be selected may be a set of parameters, for example, composed of different voltages and/or currents. In addition and beyond this feature, individual configuration parameters can also be saved in order to adjust, for example, the output power by way of the anode voltage and/or the cathode current. A configuration can comprise a set of operating parameters and/or the adjustment of individual parameters that are included in the set of operating parameters.

If, for example, an amplifier is to be operated in a specific frequency band, then this operation will require, for example, a set of parameters having a specific number (as such, for example, the number 2). Of this set of parameters the anode voltage and/or the cathode current can be changed in certain steps, in order to be able to adjust the output power, for example, to a level 18.

Therefore, one example of a configuration that could be filed could be: set number 2, output power level 18.

The same could apply to sets of configuration parameters of a pre-amplifier/a linearizer. In this case, too, a suitable set of operating parameters could be selected (such as, for example, number 2), which can include, among other things, the adjustment of the linearizer and/or a basic gain in such a way that this adjustment matches the frequency band. For example, the operating mode (the fixed gain mode (FGM), the automatic level control (ALC)), the level (gain in FGM, output power in ALC) and/or also mute on or off can be changed. Therefore, the configuration that is filed can comprise the number of the set of parameters together with the states of the parameters to be changed.

According to one embodiment of the invention, a linearization curve of a linearizer of a traveling wave tube module is saved as a plurality of configuration parameters. A traveling wave tube module can comprise a linearizer, i.e. an amplifier that is designed to balance a non-linear gain characteristic of the traveling wave tube. For this purpose a linearization curve can be saved for the linearizer; and this linearization curve is used by the linearizer to amplify the high frequency signal, which is fed to the traveling wave tube in a non-linear way. This linearization curve can be modified, for example, as a function of the frequency range; and the changes can be buffered in the non-volatile memory. In addition to a strictly linearization curve or more specifically the linearization characteristic it is also possible to save configuration parameters for the gain and the frequency response.

The linearizer can also be combined with a pre-amplifier, or it can involve a strictly pre-amplifier without a linearizer. It is also possible to save the gain and/or the frequency response of an equalizer. In this case, too, the adjustments for the linearizer/the pre-amplifier can be combined together to form 1 to n sets of parameters; and these sets of parameters can be retrieved and/or saved as a function of the application. Configuration parameters that can be saved include the set that is currently being selected. In addition and beyond this feature, additional adjustments can also be saved, for example, the different modes, for example, a fixed gain mode (FGM) or an automatic level control (ALC), different levels of gain (in FGM) and/or different levels of output power (in ALC) that can also be saved as the configuration.

An additional aspect of the invention relates to an amplifier module for a communication satellite. A module can be, for example, a module with a common housing or a common carrier element, to which the components of the amplifier module are attached and/or with which the components of the amplifier module, such as, for example, a control unit, regulator units, the amplifier unit, such as, for example, a traveling wave tube or a semiconductor amplifier, etc., can be installed together in the satellite.

According to one embodiment of the invention, the amplifier module comprises an amplifier unit and a control unit, in order to drive the amplifier unit.

The amplifier unit can be a traveling wave tube. The traveling wave tube can comprise, for example: an emitter designed to generate an electron beam when a voltage is applied; a section of an amplifier, which is traversed by the electron beam, and in which a conductor is arranged, and in which a high frequency signal, which runs through the conductor, can be amplified by means of the electron beam; and a collector that is designed to accommodate the electron beam and that feeds the electron beam back to the emitter.

Furthermore, the control unit comprises a non-volatile, writable memory designed to store at least one configuration parameter of the amplifier module, when the amplifier module is not energized by an external power supply. The non-volatile memory can be provided, for example, in a special chip that can be installed separately from the electronics of the control unit in the amplifier module.

According to one embodiment of the invention, the control unit comprises a volatile memory. It is possible that the amplifier module comprises an additional memory, the content of which is erased when the amplifier module is separated from the power supply.

According to one embodiment of the invention, the amplifier module further comprises an auxiliary voltage supply designed to supply the non-volatile memory with energy, when the amplifier module is not energized by an external power supply. For example, the auxiliary voltage supply can comprise a capacitor or a battery. In this case the capacitor or battery is charged by the external power supply, when the amplifier module is not connected to the power supply.

However, it may also be the case that the auxiliary voltage supply is used only to generate the internal power supplies during normal operation. In this case it is possible that all of the circuits of the amplifier module are in the de-energized state. That is, when the amplifier module is switched off, the circuits are disconnected from the power supply.

According to one embodiment of the invention, the amplifier module further comprises a telecommand interface designed to receive a telecommand that initiates that the configuration parameter(s) is and/or are saved in the non-volatile memory. For example, this telecommand interface may be an external interface of the amplifier module, with which the amplifier module can communicate with an additional control unit of the satellite.

According to one embodiment of the invention, the amplifier module further comprises at least one regulator unit designed to drive the amplifier unit. For example, one or more collector voltages, an anode voltage, a cathode voltage and/or any other operating variable can be regulated with this regulator unit. The control unit is designed to read out a configuration parameter of the regulator unit and to save this configuration parameter in the non-volatile memory and/or to read out the configuration parameter from the non-volatile memory and to set correspondingly in the regulator unit.

In this case, too, it is possible that the adjustments of the regulator for the various voltages are filed in sets of parameters and that it is possible to select with the configuration only the set that is currently being used. In other words, the selection of the current set of parameters may be a configuration parameter that is filed in the non-volatile memory.

According to one embodiment of the invention, the control unit is designed to carry out the method for operating the amplifier module, as described above and below. It goes without saying that the features of the amplifier module may also be the features of the method and vice versa.

The non-volatile memory and/or the control unit can be accommodated individually or in total in the power supply of the amplifier module. The non-volatile memory and/or the control unit can also be accommodated in the pre-amplifier and/or the linearizer; or it is also possible that one portion can be accommodated in the power supply, and the other portion can be accommodated in the pre-amplifier and/or the linearizer.

Furthermore, it is possible that in the case of one traveling wave tube module two traveling wave tubes are supplied with power by one power supply and, if necessary, have a common pre-amplifier; or each traveling wave tube has individually a pre-amplifier.

Some exemplary embodiments of the invention are described in detail below with reference to the accompanying figures.

BRIEF DESCRIPTION OF THE FIGURES

FIG. 1 shows in schematic form a view of a communication satellite according to one embodiment of the invention.

FIG. 2 shows in schematic form a view of an amplifier module according to one embodiment of the invention.

FIG. 3 shows a flow chart for a method for operating an amplifier module according to one embodiment of the invention.

In principle, identical or similar parts are provided with the same reference numerals.

DETAILED DESCRIPTION OF EXEMPLARY EMBODIMENTS

FIG. 1 shows a communication satellite 10 with an antenna 12, a master control unit or rather a master controller 14 and a power supply 16, which is supplied with energy from, for example, a solar panel 18.

Furthermore, the communication satellite 10 has an amplifier module 20 in the form of a traveling wave tube module 20. FIG. 1 shows only one channel of the communication satellite 10. Typically a communication satellite 10 can have a plurality of channels, each of which can comprise a traveling wave tube module 20.

The communication satellite 10 can receive a high frequency signal 22 by means of the antenna 12 and can pass the high frequency signal to the traveling wave tube module 20, where the high frequency signal 22 is amplified to an amplified high frequency signal 24 and can be emitted again by means of the antenna 12 (or an additional antenna). In this case the traveling wave tube module 20 is supplied with power 26 by means of the power supply 16. Furthermore, the traveling wave tube module 20 can be driven by the control unit 14 and can receive, for example, telecommands 28, which were received, for example, by means of the antenna 12 and were evaluated by the control unit 14.

The traveling wave tube module can be separated from the power supply 16 and re-connected again to the power supply with these telecommands and/or with a safety circuit of the control unit 14.

FIG. 2 shows a traveling wave tube module 20 in detail. The traveling wave tube module 20 comprises a traveling wave tube 30, which receives the high frequency signal 22 over a high frequency input 32 and emits the amplified high frequency signal 24 over a high frequency output 34.

The traveling wave tube 30 comprises an emitter 36, with which an electron beam 38 can be generated, and a collector 40, which accommodates again the electron beam 38. This arrangement allows the electric current from the electron beam 38 to be fed back again to the emitter 36. Between the emitter and the collector 38 there is an amplifier region 42, in which the high frequency signal 22 is amplified by means of the electron beam 38. In this case the high frequency signal 22 is sent by way of a conductor 44 through the traveling wave tube 30.

The traveling wave tube module 20 can have a channel amplifier and/or a linearizer 46 between the high frequency input 32 and the traveling wave tube 30. The non-amplified high frequency signal 22 can be either pre-amplified with the channel amplifier and/or can be linearized with the linearizer, before the high frequency signal is fed to the traveling wave tube 30.

The traveling wave tube 30 is driven by a plurality of secondary regulators or rather regulator units 48, which can adjust and/or regulate, for example, an anode voltage 50, one or more collector voltages 52, and a cathode voltage of the emitter and additional adjustable voltages or more specifically operating variables 54 of the traveling wave tube 30.

The secondary regulators 48 are supplied with a high voltage 58 by a high voltage generating device 56, which is supplied with current and/or voltage 62 by a pre-regulator and a filter 60. The pre-regulator and the filter 60 convert the current 26 from the power supply 16 of the satellite 10 to a constant and uniform direct current 62.

In addition, the traveling wave tube module 20 comprises an electronic control unit 64, which can adjust and drive the regulator units 48 and the channel amplifier and/or the linearizer 46. The unit 46 can also be a strictly pre-amplifier or a combination of an amplifier and a linearizer. Furthermore, the traveling wave tube module 20 can comprise a telecommand interface 66, which can pre-condition the telecommands 28 for the control unit 64.

The control unit 64 comprises a memory module 68, which comprises a non-volatile memory or more specifically a read only memory 70 and a volatile memory 72.

The memory module 68 or more specifically at least the non-volatile memory 70 can be supplied with power 76 by an auxiliary voltage supply 74, which is connected to the pre-regulator and the filter 60. The auxiliary voltage supply 74 can comprise a battery or a capacitor; and this battery or capacitor can be charged, when the traveling wave tube module 20 is connected to the power supply 16.

However, it is also possible that the non-volatile memory 70 is able to save de-energized data, such as, for example, a FLASH memory.

In order to control the traveling wave tube module 20, the control unit 64 can adjust certain configuration parameters, manipulated variables and/or settings 78 of the components 46, 48, 56, 60, 66, 74 and/or can send configuration parameters 78 to these components and/or can read out the configuration parameters from these components.

For example, the control unit 64 can set the values 78a of a linearization curve of the linearizer 46 and/or the desired value 78 for the cathode voltage 54 and/or the desired value 78b for the collector voltage 52.

Then the configuration parameters 78 can be saved automatically by the control unit 64 and/or on command in the non-volatile memory. For example, the volatile memory 72 comprises a configuration memory area 80, which can be balanced, for example, automatically with the non-volatile memory 70.

FIG. 3 shows a flow chart, with which the traveling wave tube module 20 can be operated.

In step 90 at least one of the configuration parameters 78 of the traveling wave tube module 20 is saved in the non-volatile memory 70. This step can be performed already on the ground and/or also in orbit. The save operation can be initiated by a telecommand 28 and/or can be done automatically by the control unit 64.

In step 92 the traveling wave tube module 20 is separated from the power supply 16 of the satellite 10. For example, a corresponding telecommand 28 can cause the master controller 14 of the satellite 10 to switch off the traveling wave tube module 20. It is also possible that the traveling wave tube module 20 is switched off by a safety circuit.

In step 94 the traveling wave tube module 20 is connected again to the power supply 16. For example, the master controller 14 of the satellite 10 receives again a corresponding telecommand and energizes again the traveling wave tube module 20.

In step 96 the configuration parameter 78 is loaded from the non-volatile memory 70 by means of the control unit 64; and the traveling wave tube module 20 is configured as a function of the loaded configuration parameter 78. If, for example, the control unit 64 detects that the traveling wave tube module 20 is switched on again or more specifically is energized again, then the control unit 64 can execute a start sequence, in which the configuration parameters 78, saved in the non-volatile memory 70, are set again for the traveling wave tube module 20. For example, the control unit can set the desired values 78a, 78b for the anode voltage 50 and the collector voltage 52 again to the values that were set, prior to the last power off of the traveling wave tube module 20.

For the sake completeness, it must be noted that the term "comprising" does not exclude other elements or steps; and that the term "one" or "a" does not exclude a plurality. Furthermore, it must be pointed out that the features or steps that have been described with reference to one of the above exemplary embodiments can also be used in combination with other features or steps of other exemplary embodiments described above. Reference numerals in the claims should not be regarded as reflecting a limitation.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating an amplifier module of a communication satellite, the method comprising the steps of:
    saving, by the communication satellite, a configuration parameter of the amplifier module in a non-volatile memory that is configured to store the configuration parameter when the amplifier module is not energized;
    loading, by the communication satellite, the configuration parameter from the non-volatile memory after the amplifier module is energized;
    configuring, by the communication satellite, the amplifier module as a function of the loaded configuration parameter.

2. The method of claim 1, further comprising the steps of:
    separating the amplifier module from a power supply of the satellite after the saving of the configuration parameter;
    connecting the amplifier module to the power supply prior to the loading the configuration parameter.

3. The method of claim 1, further comprising the steps of:
    determining a change in the configuration parameter; and
    automatically saving the configuration parameter in the non-volatile memory when the change is determined.

4. The method of claim 1, further comprising the step of:
    receiving, by the communication satellite, a telecommand that a configuration parameter is to be saved;
    wherein the configuration parameter is saved in the non-volatile memory in response to receipt of the telecommand.

5. The method of claim 1, wherein
    saving of the configuration parameter involves transferring a configuration area from a volatile memory of the amplifier module to the non-volatile memory, and
    loading of the configuration parameter involves transferring content of the non-volatile memory to the configuration area.

6. The method of claim 5 further comprising the step of:
    determining that at least one specific configuration parameter is not transferred from the configuration area to the non-volatile memory in order to prevent the configuration parameter in the non-volatile memory from being overwritten.

7. The method of claim 1, further comprising the step of:
    saving information about a set of configuration parameters of the amplifier module as the configuration parameter in the non-volatile memory.

8. The method of claim 1, wherein the configuration parameter is one of:
    an adjustment of a regulator unit to regulate a voltage of a traveling wave tube of a traveling wave tube module;
    a value of a cathode voltage of the traveling wave tube;
    a value of a Wehnelt voltage of the traveling wave tube;
    a value of an anode voltage of the traveling wave tube; and
    a value of one or more collector voltages of the traveling wave tube.

9. The method of claim 1, wherein a linearization curve of a linearizer of a traveling wave tube module is saved as a configuration parameter.

10. An amplifier module of a communication satellite, the amplifier module comprising:
    an amplifier unit; and
    a control unit coupled to the amplifier unit and configured to drive the amplifier unit;
    wherein the control unit comprises a non-volatile, writable memory that is configured to store a configuration parameter of the amplifier module when the amplifier module is not energized by an external power supply.

11. The amplifier module of claim 10, wherein the control unit comprises a volatile memory.

12. The amplifier module of claim 10, further comprising:
    an auxiliary voltage supply configured to supply the non-volatile memory with energy when the amplifier module is not energized by the external power supply.

13. The amplifier module of claim 10, further comprising:
    a telecommand interface configured to receive a telecommand that initiates a save operation of the configuration parameter in the non-volatile memory.

14. The amplifier module of claim 10, further comprising:
    at least one regulator unit coupled to the amplifier unit and configured to drive the amplifier unit;
    wherein
        the control unit is configured to read out a configuration parameter of the regulator unit or save the configuration parameter in the non-volatile memory; or
        the control unit is configured to read out the configuration parameter from the non-volatile memory and to correspondingly set the regulator unit.

15. An amplifier module of a communication satellite, the amplifier module comprising:
    an amplifier unit; and
    a control unit coupled to the amplifier unit and configured to drive the amplifier unit, wherein the control unit comprises a non-volatile, writable memory,
    wherein the control unit is configured to
        save configuration parameter of the amplifier module in the non-volatile memory when the amplifier module is not energized;
        load the configuration parameter from the non-volatile memory after the amplifier module is energized;
        configure the amplifier module as a function of the loaded configuration parameter.

* * * * *